US012735787B2

(12) United States Patent
Kim et al.

(10) Patent No.: US 12,735,787 B2
(45) Date of Patent: Sep. 15, 2026

(54) GROUP 2 METAL CONTAINING FILM FORMING COMPOSITIONS AND VAPOR DEPOSITION OF THE FILMS USING THE SAME

(71) Applicant: L'Air Liquide, Societe Anonyme pour l'Etude et l'Exploitation des Procedes Georges Claude, Paris (FR)

(72) Inventors: Daehyeon Kim, Seoul (KR); Jooho Lee, Seoul (KR); Wontae Noh, Seoul (KR)

(73) Assignee: L'Air Liquide, Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 312 days.

(21) Appl. No.: 18/409,331

(22) Filed: Jan. 10, 2024

(65) Prior Publication Data

US 2025/0223696 A1 Jul. 10, 2025

(51) Int. Cl.

*C23C 16/40* (2006.01)
*C01F 11/02* (2006.01)
*C07F 3/00* (2006.01)
*C23C 16/455* (2006.01)

(52) U.S. Cl.

CPC ........ *C23C 16/45553* (2013.01); *C01F 11/02* (2013.01); *C07F 3/00* (2013.01); *C23C 16/404* (2013.01); *C23C 16/45534* (2013.01)

(58) Field of Classification Search

CPC ............ C23C 16/45553; C23C 16/404; C23C 16/45534

See application file for complete search history.

(56) References Cited

U.S. PATENT DOCUMENTS

| | | | | |
|---|---|---|---|---|
| 8,092,721 | B2 * | 1/2012 | Gatineau | C23C 16/40 427/79 |
| 8,852,460 | B2 * | 10/2014 | Letessier | C23C 16/409 427/580 |
| 2009/0236568 | A1 * | 9/2009 | Letessier | C23C 16/45553 427/255.28 |
| 2010/0291299 | A1 * | 11/2010 | Cameron | C23C 16/45553 427/255.6 |
| 2011/0020547 | A1 * | 1/2011 | Gatineau | C07F 17/00 427/255.28 |
| 2012/0308739 | A1 * | 12/2012 | Lansalot-Matras | C23C 16/30 427/255.39 |
| 2013/0337192 | A1 * | 12/2013 | Lansalot-Matras | H01L 21/76841 427/96.8 |
| 2023/0123796 | A1 * | 4/2023 | Allen | C23C 16/30 118/715 |
| 2024/0209503 | A1 * | 6/2024 | Martinson | C23C 16/46 |

FOREIGN PATENT DOCUMENTS

| | | | | |
|---|---|---|---|---|
| CN | 114181266 A | * | 3/2022 | C07F 17/00 |
| CN | 116716593 A | * | 9/2023 | C23C 16/455 |
| EP | 2256121 | * | 12/2010 | C07F 3/00 |
| JP | 2012 007192 | | 1/2012 | |
| JP | 201225726 | * | 2/2012 | C07C 49/175 |
| JP | 5480032 | * | 2/2014 | C23C 16/14 |
| KR | 1020130123919 | * | 11/2013 | C07F 3/00 |
| WO | WO 2008/069821 | | 6/2008 | |
| WO | WO 2009020888 | * | 2/2009 | C23C 16/00 |

OTHER PUBLICATIONS

Lee, Younghee, et al., "Atomic Layer Deposition of Metal Fluorides Using HF-Pyridine as the Fluorine Precursor". Chemistry of Materials, 2016, 28, 2022-2032.*

Prete, P., et al., "Low pressure MOVPE growth and structural properties of ZnMgSe epilayers on (100)GaAs". Journal of Crystal Growth 221 (2000) 410-415.*

Madadi, Milad, et al., "Atomic and Molecular Layer Deposition of Alkali Metal Based Thin Films". ACS Appl. Mater. Interfaces 2021,13, 56793-56811.*

Hatanpaa, Timo, et al., "Precursors as enablers of ALD technology: Contributions from University of Helsinki". Coordination Chemistry Reviews, vol. 257, Issues 23-24, Dec. 2013, pp. 3297-3322.*

Hatanpaa, Timo, et al., "Synthesis and characterisation of cyclopentadienyl complexes of barium: precursors for atomic layer deposition of BaTiO3". Dalton Trans., 2004, 1181-1188.*

Vehkamaki, Marko, et al., "Atomic Layer Deposition of SrTiO3 Thin Films from a Novel Strontium Precursor-Strontium-bis(tri-isopropylcyclopentadienyl)". Chem. Vap. Deposition 2001, 7, No. 2, pp. 75-80.*

International Search Report and Written Opinion for corresponding PCT/US2025/010848, Apr. 15, 2025.

Iljina, et al., "The volatile pivalates of Y, Ba and Cu as prospective precursors for metal-organic chemical vapour deposition," Material Science & Engineering, B18, (1993), pp. 234-236.

* cited by examiner

*Primary Examiner* — Bret P Chen
(74) *Attorney, Agent, or Firm* — Yan Jiang

(57) ABSTRACT

A method of forming Group 2 metal containing films on a substrate comprises a) exposing the substrate to a vapor of a Group 2 metal containing film forming composition that contains an alkaline earth metal precursor having the formula:

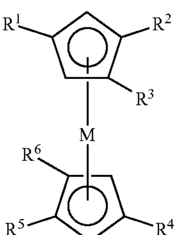

wherein M is Be, Mg, Ca, Sr, or Ba; $R^1$-$R^6$ each independently are a $C_1$-$C_{10}$ alkyl group, a fluoro group, an alkylsilyl group, a germyl group, an alkylamide or an alkylsilylamide, b) depositing at least part of the alkaline earth metal precursor onto the substrate to form a Group 2 metal-containing film through a vapor deposition process; and c) repeating a) and b) until a desired thickness of the Group 2 metal-containing film is formed.

19 Claims, 10 Drawing Sheets

| Example # | Compounds | Melting point | Phase at RT |
|---|---|---|---|
| Comparative 1 | $Sr(iPr_3Cp)_2$ | 44°C | Solid |
| Comparative 2 | $Sr(tBu_3Cp)_2$ | 143°C | Solid |
| Comparative 3 | $Ba(iPr_3Cp)_2$ | 92°C | Solid |
| **1** | $Sr(sBu_3Cp)_2$ | **<25°C** | **Liquid** |
| **2** | $Ba(sBu_3Cp)_2$ | **<25°C** | **Liquid** |

FIG. 9

GROUP 2 METAL CONTAINING FILM FORMING COMPOSITIONS AND VAPOR DEPOSITION OF THE FILMS USING THE SAME

TECHNICAL FIELD

The present invention relates generally to Group 2 metal containing film-forming compositions and using the same to deposit films, in particular, relates to forming Group 2 metal containing films using an alkaline earth metal precursor having the formula:

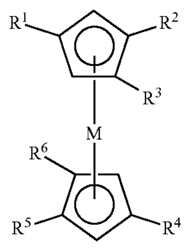

wherein M is Be, Mg, Ca, Sr, or Ba; $R^1$-$R^6$ each independently are a $C_1$-$C_{10}$ alkyl group, a fluoro group, an alkylsilyl group, a germyl group, an alkylamide or an alkylsilylamide.

BACKGROUND

As the design and manufacturing of semiconductor devices continues to evolve, the semiconductor industry is constantly seeking new and novel methods of depositing films onto substrates, such that the resulting films will have certain sought after properties.

DRAM makers are challenged to keep adequate storage capacitance per cell even as the cell size is shrinking. In order to address this challenge, the films using alkaline earth metal oxides such as SrO, BaO, CaO have been actively studied nowadays. Perovskites ($ABO_3$) materials like $SrTiO_3$ or $BaSrTiO_3$ for ultra-high-k materials, ruthenium based-materials like $CaRuO_3$, $SrRuO_3$, $BaRuO_3$ for electrode application, and SrO for doping onto dielectrics, etc. Various strontium complexes were studied in the past for the deposition of thin layer films by MOCVD (Metal-Organic Chemical Vapor Deposition), ALD (Atomic Layer Deposition) or other vapor phase deposition methods. These complexes include the following complexes.

$Sr(Me_5Cp)_2$ has been used for the deposition of strontium films. This precursor is not volatile and sometimes thermally unstable. The temperature of vaporization of $Sr(Me_5Cp)_2$ is superior to 300° C. The vaporization of the same precursor leads to 20% of residue due to decomposition.

WO2008/069821 by CAMERON et al. discloses amidinate and guanidinate. $Sr_2$(iPr-iPr-iPr-GUA)$_4$ is an example of this type of precursors. The main disadvantages of this family of precursors are their thermal instability and their lack of volatility. Amidinate and Guanidinate precursors are solid at room temperature with generally a high melting point. Moreover, they tend to form dimeric species.

β-diketonate ligands generally form solid and non-volatile complexes with Sr. $Sr(thd)_2$ is a well-known member of the β-diketonate family. The melting point of this precursor is about 210° C. and the boiling point is higher than 350° C. under atmospheric pressure. Deposition of SrO using $Sr(thd)_2$ with $O_3$ results in the formation of SrO along with $Sr_2CO_3$. No deposition was observed with $Sr(thd)_2$ and water. This precursor is not convenient for deposition due to difficulties of vaporization.

ILJINA et al. (Materials science & engineering. B, Solid-state materials for advanced technology 1993, 18, 234-236) disclose $Sr(pivalate)_2$. This precursor is solid and can be sublimed from 370° C. The vapor pressure at this temperature is only 1.33 Pa. The sublimation leads to nearly 60% of residues. This precursor can not be used for the deposition of films.

All known commercially available Group 2 metal organic compounds are solids, which are not desirable to be applied to the current semiconductor industries for use as CVD/ALD precursors. To our knowledge, there are no suitable liquid strontium metalorganic compounds with the desired thermal behavior to enable the vapor phase deposition of strontium containing films.

Accordingly, there is currently a demand for the development of a liquid precursor.

SUMMARY

Disclosed is a method of forming Group 2 metal containing films on a substrate, the method comprising a) exposing the substrate to a vapor of a Group 2 metal containing film forming composition that contains an alkaline earth metal precursor having the formula:

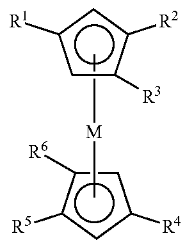

wherein M is Be, Mg, Ca, Sr, or Ba; $R^1$-$R^6$ each independently are a $C_1$-$C_{10}$ alkyl group, a fluoro group, an alkylsilyl group, a germyl group, an alkylamide or an alkylsilylamide;

b) depositing at least part of the alkaline earth metal precursor onto the substrate to form the Group 2 metal-containing film through a vapor deposition process; and c) repeating a) and b) until a desired thickness of the Group 2 metal-containing film is formed. The disclosed deposition method may include one or more of the following features:

- the vapor deposition process being a metal-organic chemical vapor deposition (MOCVD) process;
- the vapor deposition process being an ALD process;
- the vapor deposition process being a thermal ALD, spatial ALD, temporal ALD or plasma ALD process;
- the vapor deposition process being a thermal ALD process;
- the vapor deposition process being a spatial ALD process;
- the vapor deposition process being a temporal ALD process;
- the vapor deposition process being not a plasma ALD process;
- the vapor deposition process being a plasma ALD process;
- further comprising exposing the surface to a co-reactant;

the co-reactant being an oxidizer agent or a nitrogen agent;

the co-reactant being an oxidizer agent;

the co-reactant being a nitrogen agent;

further comprising the steps of purging excess vapor of the Group 2 metal containing film forming composition and excess co-reactant using an inert gas, respectively, to separate each exposure, wherein the inert gas is $N_2$, Ar, Kr or Xe;

the co-reactant being selected from $O_3$, $O_2$, $H_2O$, $H_2O_2$, $D_2O$, ROH wherein R=$C_1$-$C_{10}$ linear or branched hydrocarbon, $NH_3$, NO, $N_2O$, hydrazines, amines or combinations thereof;

the co-reactant being $H_2O$;

the co-reactant being $NH_3$;

the inert gas being $N_2$, Ar, Kr or Xe;

the alkaline earth metal precursor being mixed with a solvent;

the solvent in the mixture ranging from 0% to approximately 50%;

the solvent being a substituted or unsubstituted hydrocarbon selected from alkanes, alkenes, alkynes; alcohols selected from alkyl alcohols, amino alcohols; or amines selected from primary-, secondary-, tertiary-amines; tetrahydrofuran; dichloromethane; ethyl acetate; butyl acetate; acetonitrile; dimethylformamide;

the hydrocarbons including octane, ethyl benzene, xylene, mesitylene, decalin, decane, dodecane;

a concentration of the alkaline earth metal precursor varying in the solvent;

the metal-containing film-forming composition comprising between approximately 50% w/w and approximately 100.0% w/w of the alkaline earth metal precursor;

a concentration of the alkaline earth metal precursor in the solvent ranging between approximately 50% w/w and approximately 100.0% w/w;

the substrate being exposed to the precursor at a temperature raging from room temperature to approximately 500° C.;

the alkaline earth metal precursor being Bis(tri-sec-butyl cyclopentadienyl)Strontium(II), $Sr(sBu_3Cp)_2$;

the alkaline earth metal precursor being Bis(tri-sec-butyl cyclopentadienyl)Barium(II), $Ba(sBu_3Cp)_2$;

the alkaline earth metal precursor being Bis(tri-iso-propyl cyclopentadienyl)Strontium(II), $Sr(iPr_3Cp)_2$;

the alkaline earth metal precursor being Bis(tri-tert-butyl cyclopentadienyl)Strontium(II), $Sr(tBu_3Cp)_2$;

the alkaline earth metal precursor being Bis(tri-iso-propyl cyclopentadienyl)Barium(II), $Ba(iPr_3Cp)_2$;

the metal-containing film-forming composition comprising between approximately 0.0% w/w and approximately 5.0% w/w impurities;

the alkaline earth metal precursor being purified to a purity ranging from approximately 95% by weight or w/w to approximately 100% w/w;

the alkaline earth metal precursor being purified to a purity ranging from approximately 99% w/w to approximately 99.999% w/w the alkaline earth metal precursor being purified to a purity ranging from approximately 99% w/w to approximately 100% w/w;

the Group 2 metal-containing film being a SrO film; and the Group 2 metal-containing film being a BaO film.

Disclosed is also a method of depositing a SrO film on a substrate, the method comprising the steps of:

a) exposing the substrate to a vapor of Bis(tri-sec-butyl cyclopentadienyl)Strontium(II), $Sr(sBu_3Cp)_2$;

b) exposing the substrate to a co-reactant $H_2O$;

c) depositing at least part of the alkaline earth metal precursor onto the substrate to form the SrO film through a vapor deposition process; and d) repeating a)-c) until a desired thickness of the SrO film is formed. The disclosed deposition method may include one or more of the following features:

the vapor deposition process being a MOCVD process;

the vapor deposition process being an ALD process;

the vapor deposition process being a thermal ALD, spatial ALD, temporal ALD or plasma ALD process;

the vapor deposition process being a thermal ALD process;

the vapor deposition process being a spatial ALD process;

the vapor deposition process being a temporal ALD process;

the vapor deposition process being not a plasma ALD process;

the vapor deposition process being a plasma ALD process;

further comprising purging excess vapor of the Group 2 metal containing film forming composition and excess co-reactant using an inert gas, respectively, to separate each exposure, wherein the inert gas is $N_2$, Ar, Kr or Xe;

$Sr(sBu_3Cp)_2$ being mixed with a solvent;

the solvent in the mixture ranging from 0% to approximately 50%;

the solvent being a substituted or unsubstituted hydrocarbon selected from alkanes, alkenes, alkynes; alcohols selected from alkyl alcohols, amino alcohols; or amines selected from primary-, secondary-, tertiary-amines; tetrahydrofuran; dichloromethane; ethyl acetate; butyl acetate; acetonitrile; dimethylformamide;

the hydrocarbons including octane, ethyl benzene, xylene, mesitylene, decalin, decane, dodecane;

a concentration of $Sr(sBu_3Cp)_2$ varying in the solvent;

a concentration of $Sr(sBu_3Cp)_2$ in the solvent ranging between approximately 50% w/w and approximately 100.0% w/w;

the substrate being exposed to the precursor at a temperature raging from room temperature to approximately 500° C.;

$Sr(sBu_3Cp)_2$ comprising between approximately 0.0% w/w and approximately 5.0% w/w impurities;

$Sr(sBu_3Cp)_2$ being purified to a purity ranging from approximately 95% by weight or w/w to approximately 100% w/w;

$Sr(sBu_3Cp)_2$ being purified to a purity ranging from approximately 99% w/w to approximately 99.999% w/w; and $Sr(sBu_3Cp)_2$ being purified to a purity ranging from approximately 99% w/w to approximately 100% w/w.

Disclosed is also a method of depositing a BaO film on a substrate, the method comprising the steps of:

a) exposing the substrate to a vapor of Bis(tri-sec-butyl cyclopentadienyl)Barium(II), $Ba(sBu_3Cp)_2$;

b) exposing the substrate to a co-reactant $H_2O$;

c) depositing at least part of the alkaline earth metal precursor onto the substrate to form the BaO film through a vapor deposition process; and d) repeating a)-c) until a desired thickness of the BaO film is formed. The disclosed deposition method may include one or more of the following features:

the vapor deposition process being a MOCVD process;

the vapor deposition process being an ALD process;

the vapor deposition process being a thermal ALD, spatial ALD, temporal ALD or plasma ALD process;

the vapor deposition process being a thermal ALD process;

the vapor deposition process being a spatial ALD process;

the vapor deposition process being a temporal ALD process;

the vapor deposition process being not a plasma ALD process;

the vapor deposition process being a plasma ALD process;

further comprising purging excess vapor of the Group 2 metal containing film forming composition and excess co-reactant using an inert gas, respectively, to separate each exposure, wherein the inert gas is $N_2$, Ar, Kr or Xe;

$Ba(sBu_3Cp)_2$ being mixed with a solvent;

the solvent in the mixture ranging from 0% to approximately 50%;

the solvent being a substituted or unsubstituted hydrocarbon selected from alkanes, alkenes, alkynes; alcohols selected from alkyl alcohols, amino alcohols; or amines selected from primary-, secondary-, tertiary-amines; tetrahydrofuran; dichloromethane; ethyl acetate; butyl acetate; acetonitrile; dimethylformamide;

the hydrocarbons including octane, ethyl benzene, xylene, mesitylene, decalin, decane, dodecane;

a concentration of $Ba(sBu_3Cp)_2$ varying in the solvent;

a concentration of $Ba(sBu_3Cp)_2$ in the solvent ranging between approximately 50% w/w and approximately 100.0% w/w;

the substrate being exposed to the precursor at a temperature raging from room temperature to approximately 500° C.;

$Ba(sBu_3Cp)_2$ comprising between approximately 0.0% w/w and approximately 5.0% w/w impurities;

$Ba(sBu_3Cp)_2$ being purified to a purity ranging from approximately 95% by weight or w/w to approximately 100% w/w;

$Ba(sBu_3Cp)_2$ being purified to a purity ranging from approximately 99% w/w to approximately 99.999% w/w; and $Ba(sBu_3Cp)_2$ being purified to a purity ranging from approximately 99% w/w to approximately 100% w/w.

Notation and Nomenclature

The following detailed description and claims utilize a number of abbreviations, symbols, and terms, which are generally well known in the art. Certain abbreviations, symbols, and terms are used throughout the following description and claims, and include:

As used herein, the indefinite article “a” or “an” means one or more.

As used herein, “about” or “around” or “approximately” in the text or in a claim means ±10% of the value stated.

As used herein, “room temperature” in the text or in a claim means from approximately 20° C. to approximately 25° C.

The term “ambient temperature” refers to an environment temperature approximately 20° C. to approximately 25° C.

Note that herein, the terms “precursor” and “deposition compound” and “deposition gas” may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

Note that herein, the terms “deposition temperature” and “substrate temperature” may be used interchangeably. It is understood that a substrate temperature may correspond to, or be related to a deposition temperature, and that the deposition temperature may refer to the substrate temperature.

Please note that the films or layers deposited, such as silicon oxide or silicon nitride, may be listed throughout the specification and claims without reference to their proper stoichiometry (i.e., SiO, $SiO_2$, $SiO_3$, $Si_3N_4$). The layers may include oxide ($Si_nO_m$) layers, or mixtures thereof, wherein m and n inclusively range from 1 to 6. For instance, silicon oxide is $Si_nO_m$, wherein n ranges from 0.5 to 1.5 and m ranges from 1.5 to 3.5. More preferably, the silicon oxide layer is SiO or $SiO_2$. The silicon oxide layer may be a silicon oxide based dielectric material, such as organic based or silicon oxide based low-k dielectric materials such as the Black Diamond II or III material by Applied Materials, Inc. with a formula of SiOCH. Alternatively, any referenced silicon-containing layer may be pure silicon. Silicon-containing film may also include $Si_aO_bC_cN_dH_e$ where a, b, c, d, e range from 0.1 to 6 and b, c, d, e each may be independently 0. Alternatively, any silicon-containing layers may also include dopants, such as B, C, P, As and/or Ge.

The term “substrate” refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiC, SiCN, SiOCN, SiCOH, etc.), metal containing layers (e.g., copper, cobalt, ruthenium, tungsten, manganese, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms “film” or “layer” used herein refer to a thickness of some material laid on or spread over a surface and that the surface may be a trench or a line. Throughout the specification and claims, the wafer and any associated layers thereon are referred to as substrates.

Note that herein, the terms “film” and “layer” may be used interchangeably. It is understood that a film may correspond to, or related to a layer, and that the layer may refer to the film. Furthermore, one of ordinary skill in the art will recognize that the terms “film” or “layer” used herein refer to a thickness of some material laid on or spread over a surface and that the surface may range from as large as the entire wafer to as small as a trench or a line.

The term “wafer”, “patterned wafer” or “workpiece” refers to a wafer having a stack of films on a substrate and at least the top-most film having topographic features that have been created in steps prior to the deposition of the indium containing film. The “wafer” or “patterned wafer”

refers to a wafer having a stack of films on a substrate and a patterned hardmask layer on the stack of the films formed for pattern etch.

The term "processing" as used herein includes patterning, exposure, development, etching, deposition, cleaning, and/or removal of by-products, as required in forming a described structure.

The term "mask" refers to a layer that resists etching. The mask layer may be located above the layer to be etched. The mask layer also refers to a hardmask layer.

The term "aspect ratio" refers to a ratio of the height of a trench (or aperture) to the width of the trench (or the diameter of the aperture).

The term "high aspect ratio (HAR)" refers to an aspect ratio ranging from approximately 1:1 to approximately 500:1, preferably from approximately 20:1 to approximately 400:1.

The term "high aspect ratio etching" refers to the formation of a hole pattern in a target film by plasma etching method when aspect ratio of formed hole structures is exceeding value of 5.

Note that herein, the terms "aperture", "via", "hole", "trench" and "structure" may be used interchangeably, and generally mean an opening formed in a semiconductor structure and/or in an interlayer insulator.

The terms "dope" or "doping" is used interchangeably to the process of incorporation of one or more elements into a film through various methods where that element may be chemically bond or physically bond, and the process of intentionally incorporating atoms of different elements into the film composition. The element(s) may be doped interstitial or substitutional within the film.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

As used herein, the term "film forming composition" refers to a mixture of components used for deposition that may contain precursors, catalysts, surfactants, wetting agents, and other polymers, oligomers or monomers such as, but is not limited to, polysilazane, polycarbosilanes, polysilanes, etc.

As used herein, the term "hydrocarbon" refers to a saturated or unsaturated function group containing exclusively carbon and hydrogen atoms. As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the term "hydrofluorocarbon" refers to a saturated or unsaturated function group containing exclusively carbon, fluoride and hydrogen atoms.

As used herein, the term "fluorocarbon" refers to a saturated or unsaturated function group containing exclusively fluoride and hydrogen atoms.

As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, tert-butyl, sec-butyl); the abbreviation "tBu" refers to a tert-butyl group; the abbreviation "sBu" refers to a sec-butyl group; the abbreviation "iBu" refers to an iso-butyl group; the abbreviation "Ph" refers to a phenyl group; the abbreviation "Am" refers to any amyl group (iso-amyl, sec-amyl, tert-amyl); the abbreviation "Cy" refers to a cyclic hydrocarbon group (cyclobutyl, cyclopentyl, cyclohexyl, etc.); the abbreviation "Ar" refers to an aromatic hydrocarbon group (phenyl, xylyl, mesityl, etc.).

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where M is an atom, x is 2 or 3, the two or three $R^1$ groups may, but need not be identical to each other or to $R^2$ or to $R^3$. Further, it should be understood that unless specifically stated otherwise, values of R groups are independent of each other when used in different formulas.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Optional or optionally means that the subsequently described event or circumstances may or may not occur. The description includes instances where the event or circumstance occurs and instances where it does not occur.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

"Comprising" in a claim is an open transitional term that means the subsequently identified claim elements are a nonexclusive listing (i.e., anything else may be additionally included and remain within the scope of "comprising"). "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actors in the absence of express language in the claim to the contrary.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein:

FIG. 9 shows a comparison table; and

DESCRIPTION OF PREFERRED EMBODIMENTS

Figure 1:
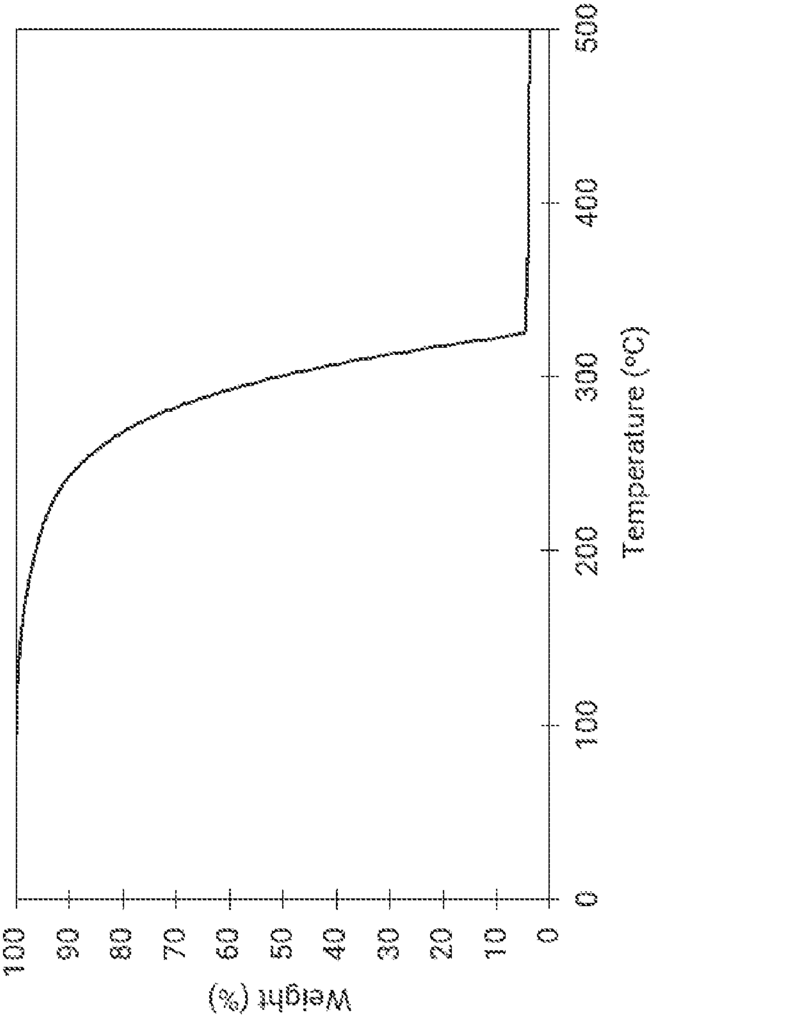
FIG. 1 shows a ThermoGravimetric Analysis (TGA) graph demonstrating the percentage of weight with increasing temperature of Bis(tri-sec-butyl cyclopentadienyl)Strontium(II), $Sr(sBu_3Cp)_2$.

Disclosed are Group 2 metal containing film forming compositions and using the same to deposit films. More specifically, the disclosed are new class of thermally stable liquid Group 2 organometallic compounds and their use to deposit Group 2 metal-containing films by either ALD or MOCVD processes.

The Group 2 metal containing film forming compositions may contain steric metallocenes, such as tri-alkyl substituted cyclopentadienyl Ca, Sr or Ba compounds, which are one of the most promising precursors for film deposition in superconductor and semiconductor fabrication due to their high volatilities, thermal stability, stable monomeric structure, and relatively low melting point.

However, most of the steric metallocenes are solid at room temperature. For example, melting points of some of the exemplary steric metallocenes are listed in Table 1.

TABLE 1

| Compounds | Melting points |
|---|---|
| $Sr(iPr_3Cp)_2$ | 44° C. |
| $Sr(tBu_3Cp)_2$ | 143° C. |
| $Ba(iPr_3Cp)_2$ | 92° C. |

In the case of solids, the steric metallocenes usually have strong intermolecular force of attraction, and tightly packed in a regular pattern. Therefore, if molecular structures have asymmetric ligands or long flexible alkyl chains, disorder may be created in the lattice packaging and materials tend to be liquids.

The disclosed Group 2 metal containing film forming compositions comprise alkaline earth metal precursors. The disclosed alkaline earth metal precursors may be developed by introducing more flexible and linear alkyl chains than iso-propyl or tert-butyl, into cyclopentadienyl-alkaline earth metal compounds to increase the degree of freedom in the molecules.

The disclosed alkaline earth metal precursors have the following general formula:

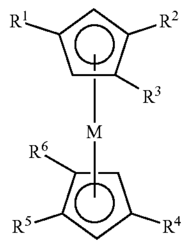

wherein M=Be, Mg, Ca, Sr, or Ba; $R^1$-$R^6$ each independently are a $C_1$-$C_{10}$ alkyl group, a fluoro group, an alkylsilyl group, a germyl group, an alkylamide or an alkylsilylamide.

Exemplary the alkaline earth metal precursors include Bis(tri-sec-butyl cyclopentadienyl)Strontium(II), $Sr(sBu_3Cp)_2$, Bis(tri-sec-butyl cyclopentadienyl)Barium(II), $Ba(sBu_3Cp)_2$, Bis(tri-iso-propyl cyclopentadienyl)Strontium(II), $Sr(iPr_3Cp)_2$, Bis(tri-tert-butyl cyclopentadienyl) Strontium(II), $Sr(tBu_3Cp)_2$, Bis(tri-iso-propyl cyclopentadienyl)Barium(II), $Ba(iPr_3Cp)_2$, and the like.

The disclosed Group 2 metal containing film forming composition includes the liquid alkaline earth metal precursor Bis(tri-sec-butyl cyclopentadienyl)Strontium(II), $Sr(sBu_3Cp)_2$.

The disclosed Group 2 metal containing film forming composition includes the liquid alkaline earth metal precursor Bis(tri-sec-butyl cyclopentadienyl)Barium(II), $Ba(sBu_3Cp)_2$.

The disclosed Group 2 metal containing film forming composition includes the liquid alkaline earth metal precursor Bis(tri-iso-propyl cyclopentadienyl)Strontium(II), $Sr(iPr_3Cp)_2$.

The disclosed Group 2 metal containing film forming composition includes the liquid alkaline earth metal precursor Bis(tri-tert-butyl cyclopentadienyl)Strontium(II), $Sr(tBu_3Cp)_2$.

The disclosed Group 2 metal containing film forming composition includes the liquid alkaline earth metal precursor Bis(tri-iso-propyl cyclopentadienyl)Barium(II), $Ba(iPr_3Cp)_2$.

The disclosed alkaline earth metal precursors may be liquid at atmosphere pressure and suitable for deposition of metal-containing films, such as SrO or BaO film, by vapor deposition methods, such as, ALD or MOCVD, and have the following advantages:

Normally, the disclosed alkaline earth metal precursors generate less particles compared to solid precursors even in a solution state, such as no particles blowing into a precursor delivery line and therefore, into processing wafers in a chamber. Also, the disclosed alkaline earth metal precursors reduce the frequency of chamber maintenance, leading to a longer life time of using the chamber than using the solid precursors;

The liquid precursor has an advantage to produce very constant delivery of materials, due to the constant surface area inside the canister, compared to the solid precursors which aggregate over the time during heating and show variable surface areas of particles, generating non-constant vapor pressure.

While the disclosed alkaline earth metal precursor are ideally liquids and vaporized in bubblers or direct liquid injection systems, the use of solid precursors for ALD precursor vaporization is also possible using existing sublimators. Alternatively, the solid precursors may be mixed or dissolved in a solvent to reach a usable melting point and viscosity for usage by Direct Liquid Injection systems. Alternatively, the liquid precursors may also be mixed with a solvent to lower their viscosity.

The solvent may be substituted or unsubstituted hydrocarbons, such as, alkanes, alkenes, alkynes, etc.; alcohols such as alkyl alcohols, amino alcohols, etc.; or amines, such as primary-, secondary-, tertiary-amines; tetrahydrofuran; dichloromethane; ethyl acetate; butyl acetate; acetonitrile; dimethylformamide. The hydrocarbons may include octane, ethyl benzene, xylene, mesitylene, decalin, decane, dodecane, or the like. A concentration of the alkaline earth metal precursor in the solvent varies, for example, a concentration of the alkaline earth metal precursor in the solvent may range from approximately 50% w/w to approximately 100.0% w/w. Preferably, the solvent contained in the mixture of the liquid precursors and the solvent ranges from 0% to approximately 50%.

The disclosed metal-containing film-forming compositions may comprise between approximately 50% w/w and approximately 100.0% w/w of the alkaline earth metal precursor.

To ensure process reliability, the disclosed alkaline earth metal precursor may be purified by continuous or fractional batch distillation or sublimation prior to use to a purity ranging from approximately 95% by weight or w/w to approximately 100% w/w, preferably ranging from approximately 99% w/w to approximately 99.999% w/w, more preferably, ranging from approximately 99% w/w to approximately 100% w/w.

The disclosed alkaline earth metal precursor may contain any of the following impurities: undesired congeneric species; solvents; chlorinated metal compounds; or other reaction products. In one alternative, the total quantity of these impurities is below 5.0% w/w, preferably, below 0.1% w/w.

Solvents, such as hexane, pentane, dimethyl ether, or anisole, may be used in the precursor's synthesis. The concentration of the solvent in the disclosed Metal-containing precursors may range from approximately 0% w/w to approximately 5% w/w, preferably from approximately 0% w/w to approximately 0.1% w/w. Separation of the solvents from the precursor may be difficult if both have similar boiling points. Cooling the mixture may produce solid precursor in liquid solvent, which may be separated by filtration. Vacuum distillation may also be used, provided the precursor product is not heated above approximately its decomposition point.

In one alternative, the disclosed alkaline earth metal precursors contain less than 5% v/v, preferably less than 1% v/v, more preferably less than 0.1% v/v, and even more preferably less than 0.01% v/v of any of its undesired congeneric species, reactants, or other reaction products. This alternative may provide better process repeatability. This alternative may be produced by distillation of the disclosed alkaline earth metal precursors.

In another alternative, the disclosed alkaline earth metal precursors may contain between 5% v/v and 50% v/v of one or more of congeneric metal-containing precursors, reactants, or other reaction products, particularly when the mixture provides improved process parameters or isolation of the target compound is too difficult or expensive. For example, a mixture of two alkaline earth metal precursors may produce a stable, liquid mixture suitable for vapor deposition.

In another alternative, the disclosed alkaline earth metal precursors may contain between approximately 0 ppbw and approximately 500 ppbw metal impurities.

The concentration of trace metals and metalloids in the disclosed alkaline earth metal precursors may each range from approximately 0 ppb to approximately 100 ppb, and more preferably from approximately 0 ppb to approximately 10 ppb.

In addition to the disclosed alkaline earth metal precursors, a reactant or a co-reactant may also be introduced into the reaction chamber. The co-reactant may be an oxygen-containing gas or a nitrogen-containing gas for metal oxide film deposition. The co-reactants include, but are not limited to, oxidizers such as, $O_3$, $O_2$, $H_2O$, $H_2O_2$, $D_2O$, ROH ($R{=}C_1$-$C_{10}$ linear or branched hydrocarbon), etc.

The ALD sequence may include sequential pulses of several compounds. For instance, the surface may be exposed to $O_2/O_3$ followed by $H_2O$ in order to increase the density of hydroxyl groups on the surface.

Alternatively, the co-reactant may be a nitrogen-containing gas for Nitrogen-containing film deposition. The nitrogen-containing gas includes, but is not limited to, $NH_3$, NO, $N_2O$, hydrazines, primary amines such as methylamine, ethylamine, tertbutylamine; secondary amines such as dimethylamine, diethylamine, di-isopropylamine, ethylmethylamine, pyrrolidine; tertiary amines such as trimethylamine, triethylamine, trisilylamine, $N_2$, $N_2/H_2$ mixture thereof, preferably $NH_3$. The co-reactant may be selected from $NH_3$, NO, $N_2O$, hydrazines, amines or combinations thereof.

Also disclosed are methods or processes for forming Group 2 metal-containing film on a substrate through vapor deposition process. In one embodiment, the method for forming a Group 2 metal-containing film on a substrate comprises the steps of a) providing the substrate in a reaction chamber, b) exposing the substrate to a vapor including a disclosed Group 2 metal containing film forming composition that contains a disclosed alkaline earth metal precursor, c) depositing at least part of the disclosed alkaline earth metal precursor onto the substrate to form a Group 2 metal-containing film through a vapor deposition process, and-repeating b) and c) until a desired thickness of the Group 2 metal-containing film is formed.

The method further comprises the step of exposing the substrate to a co-reactant following the step b), wherein the co-reactant is selected from $O_3$, $O_2$, $H_2O$, $H_2O_2$, $D_2O$, ROH ($R{=}C_1$-$C_{10}$ (linear or branched)) hydrocarbon, $NH_3$, NO, $N_2O$, hydrazines, amines or combinations thereof. For example, one or a combination of the above co-reactants may be used for deposition of silicon oxynitride films, either by co-flowing the co-reactant, or sequentially.

In an alternative embodiment, the method for forming a Group 2 metal-containing film on a substrate comprises the steps of a) providing a substrate in a reaction chamber, b) exposing the substrate to a vapor of a disclosed Group 2 metal containing film forming composition that contains a disclosed alkaline earth metal precursor such as, Bis(tri-sec-butyl cyclopentadienyl)Strontium(II), $Sr(sBu_3Cp)_2$, Bis(tri-sec-butyl cyclopentadienyl)Barium(II), $Ba(sBu_3Cp)_2$, Bis (tri-iso-propyl cyclopentadienyl)Strontium(II), $Sr(iPr_3Cp)_2$, Bis(tri-tert-butyl cyclopentadienyl)Strontium(II), $Sr(tBu_3Cp)_2$, Bis(tri-iso-propyl cyclopentadienyl)Barium (II), $Ba(iPr_3Cp)_2$, and c) depositing the Group 2 metal-containing film on the substrate in a vapor deposition process. The method further comprises the step of exposing the substrate to a co-reactant following the step b), wherein the co-reactant is selected from $O_3$, $O_2$, $H_2O$, $H_2O_2$, $D_2O$, ROH ($R{=}C_1$-$C_{10}$ (linear or branched)) hydrocarbon, $NH_3$, NO, $N_2O$, hydrazines, amines or combinations thereof. The method further comprises the steps of repeating the exposing to the vapor of the Group 2 metal containing film forming composition and the exposing to the co-reactant until a desired thickness of the Group 2 metal-containing film is formed, and purging excess vapor of the Group 2 metal containing film forming composition and excess co-reactant using an inert gas, respectively, to separate each exposure, wherein the inert gas is $N_2$, Ar, Kr or Xe.

The disclosed processes using the disclosed alkaline earth metal precursors include ALD processes for deposition of Group 2 metal containing films. Suitable ALD methods include thermal ALD, spatial ALD, and temporal ALD. Suitable ALD methods may also include plasma ALD methods. Preferably the suitable ALD methods do not use a plasma, as it is extremely difficult to grow conformal films in high aspect ratio with this type of ALD. It is understood that the suitable ALD may operate in a non-perfect self-limited growth regime, allowing some parasitic CVD to happen. Such parasitic CVD may not be a problem as long as the deposited film meets conformity requirements.

The disclosed processes using the disclosed alkaline earth metal precursors also include MOCVD process for deposition of Group 2 metal containing films.

The reaction chamber may be any enclosure or chamber of a device in which deposition methods take place, such as, without limitation, a parallel-plate type reaction chamber, a hot-wall type reaction chamber, a single-wafer reaction chamber, a multi-wafer reaction chamber, or other such types of deposition systems. All of these exemplary reaction chambers are capable of serving as an ALD reaction chamber.

The reaction chamber contains one or more substrates onto which the films will be deposited. A substrate is generally defined as the material on which a process is conducted. The substrates are cleaned to remove native oxides and dried before deposition. The substrates may be any suitable substrate used in semiconductor, photovoltaic, flat panel, or LCD-TFT device manufacturing. Examples of suitable substrates include wafers, such as metal (e.g., W, Ge, etc.), silicon, SiGe, silica, or glass. The substrate may also have one or more surface areas of differing materials already deposited upon it from a previous manufacturing step. For example, the wafers may include dielectric surfaces and conductive or electrode surfaces exposed simultaneously, such as, metal surfaces, metal oxide surfaces, silicon surfaces, silicon layers (crystalline, amorphous, porous, etc.), silicon oxide layers/surfaces, silicon nitride layers/surfaces, silicon oxy nitride layers/surfaces, carbon doped silicon oxide (SiCOH) layers/surfaces, or combinations thereof. Additionally, the wafers may include copper, cobalt, ruthenium, tungsten and/or other metal layers (e.g., platinum, palladium, nickel, ruthenium, or gold). The wafers may include barrier layers or electrodes, such as tantalum, tantalum nitride, etc. The wafers may be planar or patterned. The substrate may include layers of oxides which have the oxide surface exposed and are used as dielectric materials in 3D NAND, MIM, DRAM, or FeRam technologies (for example, $ZrO_2$ based materials, $HfO_2$ based materials, $TiO_2$ based materials, rare earth oxide based materials, ternary oxide based materials, etc.) or from nitride-based films (for example, TaN, TiN, NbN) that are used as electrodes. The disclosed processes may deposit the metal-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers/surfaces thereon are referred to as substrates. The actual substrate utilized may also depend upon the specific precursor embodiment utilized.

The disclosed processes using the disclosed alkaline earth metal precursors may be performed for substrates having a temperature range from room temperature to approximately 500° C.

The temperature of the reaction chamber may be controlled by either controlling the temperature of the substrate holder or controlling the temperature of the reaction chamber wall. Devices used to heat the substrate are known in the art. The reaction chamber wall is heated to a sufficient temperature to obtain the desired film at a sufficient growth rate and with desired physical state and composition. A non-limiting exemplary temperature range to which the reaction chamber wall may be heated includes from room temperature to approximately 500° C.

The substrate exposure time in the reaction chamber in the disclosed processes using the disclosed precursors may range from 1 millisecond to 5 minutes, preferably from 1 millisecond to 60 seconds. The co-reactant exposure time in the reaction chamber in the disclosed processes may range from 1 millisecond to 1 minute, preferably from 100 milliseconds to 30 seconds.

The pressure within the reaction chamber are held at conditions suitable for the precursor to react with the surface of the substrate. For instance, the pressure in the chamber may be held between approximately 0.1 mTorr and approximately 1000 Torr, preferably between approximately 1 mTorr and approximately 400 Torr, more preferably between approximately 0.1 Torr and approximately 100 Torr, even more preferably between approximately 0.5 Torr and approximately 10 Torr.

The disclosed process or sequence typically includes steps to remove excess precursor and excess co-reactant from the deposition surface by providing a purge step, either by purging a reaction chamber with an inert gas, or passing the substrate in a sector under high vacuum and/or a carrier gas curtain. The inert gas is $N_2$, Ne, Ar, Kr, or Xe, preferably, $N_2$ or Ar.

The disclosed alkaline earth metal precursors and the co-reactants may be introduced into the reaction chamber sequentially (ALD). The reaction chamber may be purged with an inert gas between the introduction of the precursor and the introduction of the co-reactant and after the introduction of the co-reactant. Alternatively, the substrate can be moved from one area for precursor exposure to another area for co-reactant exposure (spatial ALD).

Depending on the particular process parameters, deposition may take place for a varying length of time. Generally, deposition may be allowed to continue as long as desired or necessary to produce a film with the necessary thickness. Typical film thicknesses may vary from an atomic monolayer to several hundreds of microns, depending on the specific deposition process, preferably between 0.1 and 100 nm, more preferably between 0.1 and 50 nm. The deposition process may also be performed as many times as necessary to obtain the desired film.

In one non-limiting exemplary ALD process, the vapor phase of the disclosed alkaline earth metal precursor is introduced into the reaction chamber, where the alkaline earth metal precursor physisorbs or chemisorbs on a substrate. Excess composition may then be removed from the reaction chamber by purging and/or evacuating the reaction chamber. A desired gas (for example, oxidizer $H_2O$ or $O_3$) is introduced into the reaction chamber where it reacts with the physisorbs or chemisorbed precursor in a self-limiting manner. Any excess oxidizer gas is removed from the reaction chamber by purging and/or evacuating the reaction chamber.

EXAMPLES

The following non-limiting examples are provided to further illustrate embodiments of the invention. However, the examples are not intended to be all inclusive and are not intended to limit the scope of the inventions described herein.

Example 1 Synthesis of Bis(tri-sec-butyl cyclopentadienyl)Strontium(II), $Sr(sBu_3Cp)_2$

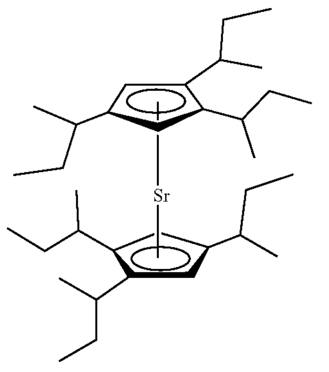

To a solution of $SrI_2$ (1.88 g, 5.51 mmol) in 30 mL of THF at −30° C., was added dropwise a solution of $K(sBu_3Cp)$ (3.3 g, 12.11 mmol). The reaction mixture was warmed slowly to room temperature with stirring overnight. After filtration, the solvent was removed under reduced pressure to obtain a brown liquid. The material was then purified by distillation up to 130° C.@25 mTorr to give 1.2 g (40.0%) of yellow oil. The material was characterized by NMR $^1H$ (δ, ppm, $C_6D_6$): 5.62 (m, 4H), 2.57 (m, 6H), 1.52 (m, 12H), 1.34, 1.18 (m, 18H), 0.96, 0.88 (m, 18H).

Figure 2:
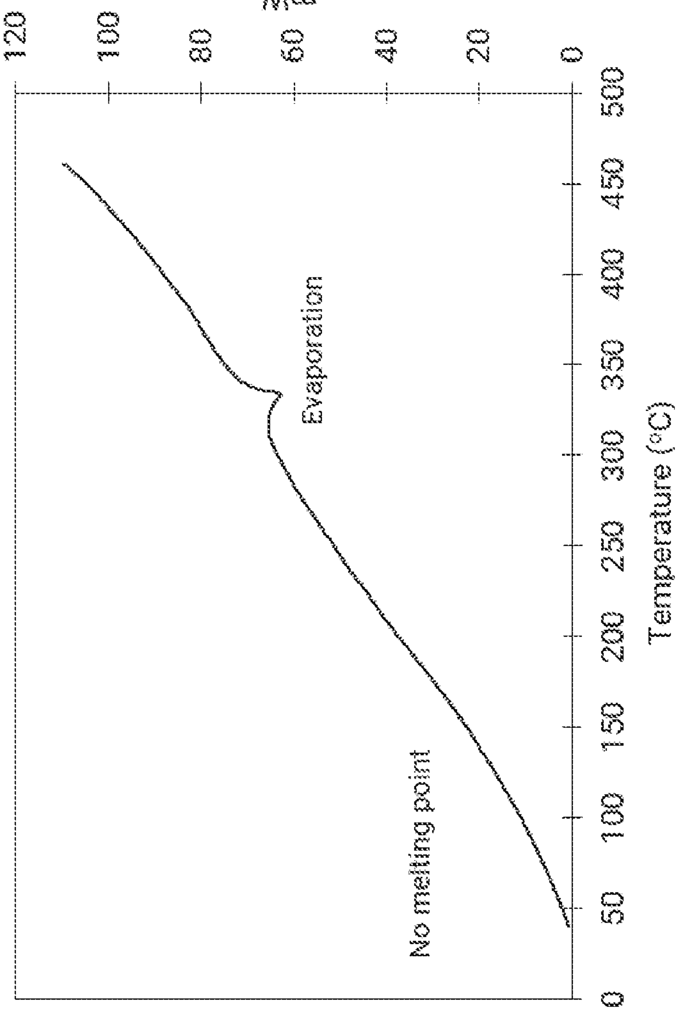
FIG. 2 shows a Differential thermal analysis (DTA) graph demonstrating the melting point of Bis(tri-sec-butyl cyclopentadienyl)Strontium(II), $Sr(sBu_3Cp)_2$.
Figure 3:
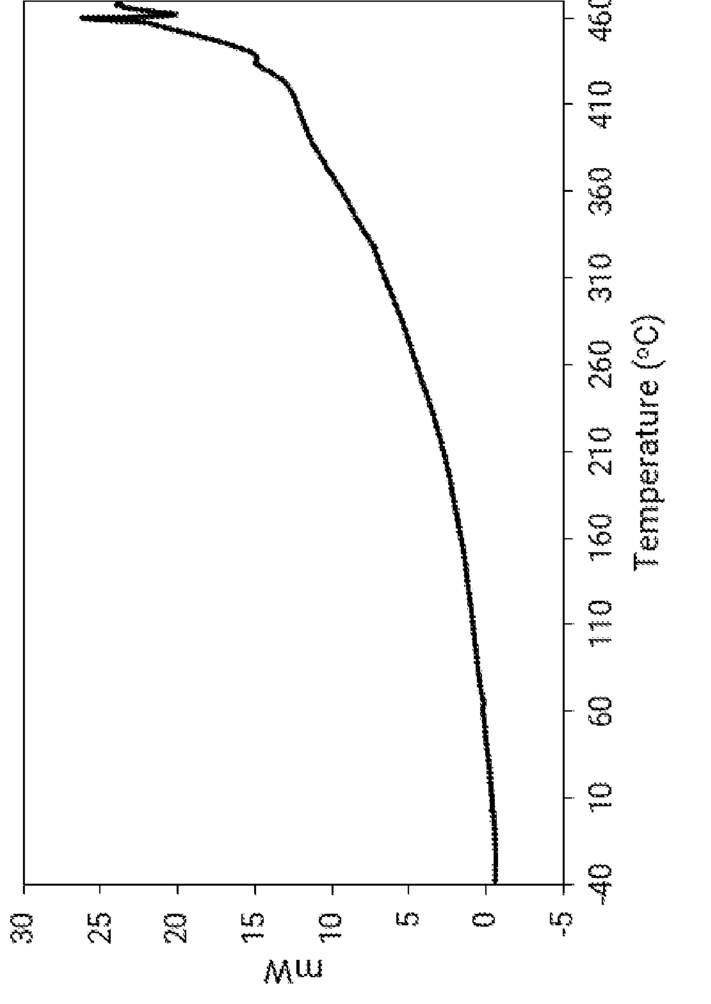
FIG. 3 shows a Differential scanning calorimetry (DSC) of Bis(tri-sec-butyl cyclopentadienyl)Strontium(II), $Sr(sBu_3Cp)_2$.

The purified product left a 3.8% residual mass and showed no melting point during open-cup TGA/DTA analysis measured at a temperature rising rate of 10° C./min in an inert atmosphere that flows nitrogen at 200 mL/min. These results are shown in FIG. 1 and FIG. 2, which are TGA and DTA graphs illustrating the weight (%) and heat flow, upon temperature increase. Onset temperature of decomposition (430° C.) of the product was measured by Differential scanning calorimetry (DSC), which are shown in FIG. 3.

Example 2 Synthesis of Bis(tri-sec-butyl cyclopentadienyl)Barium(II), $Ba(sBu_3Cp)_2$

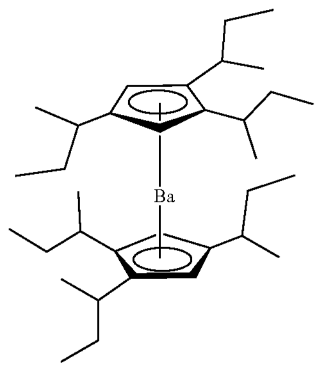

To a solution of $BaI_2$ (2 g, 5.1 mmol) in 30 mL of THE at −30° C., was added dropwise a solution of $K(sBu_3Cp)$ (3.2 g, 11.76 mmol). The reaction mixture was warmed slowly to room temperature with stirring overnight. After filtration, the solvent was removed under reduced pressure to obtain a brown liquid. The material was then purified by distillation up to 130° C.@25 mTorr to give 1.0 g (32.5%) of yellow oil. The materials was characterized by NMR $^1H$ (δ, ppm, $C_6D_6$): 5.5 (m, 4H), 2.63 (m, 6H), 1.66, 1.54 (m, 12H), 1.27, 1.20 (m, 18H), 0.99 (m, 18H).

Figure 4:
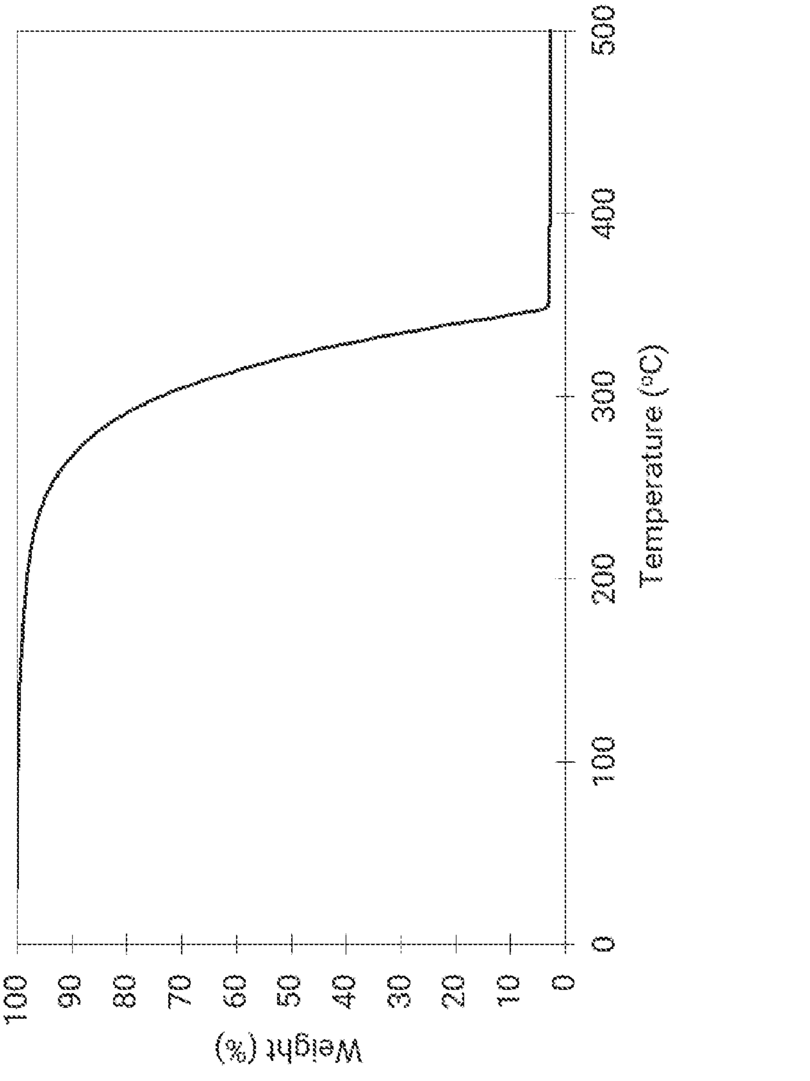
FIG. 4 shows a TGA graph demonstrating the percentage of weight with increasing temperature of Bis(tri-sec-butyl cyclopentadienyl)Barium(II), $Ba(sBu_3Cp)_2$.
Figure 5:
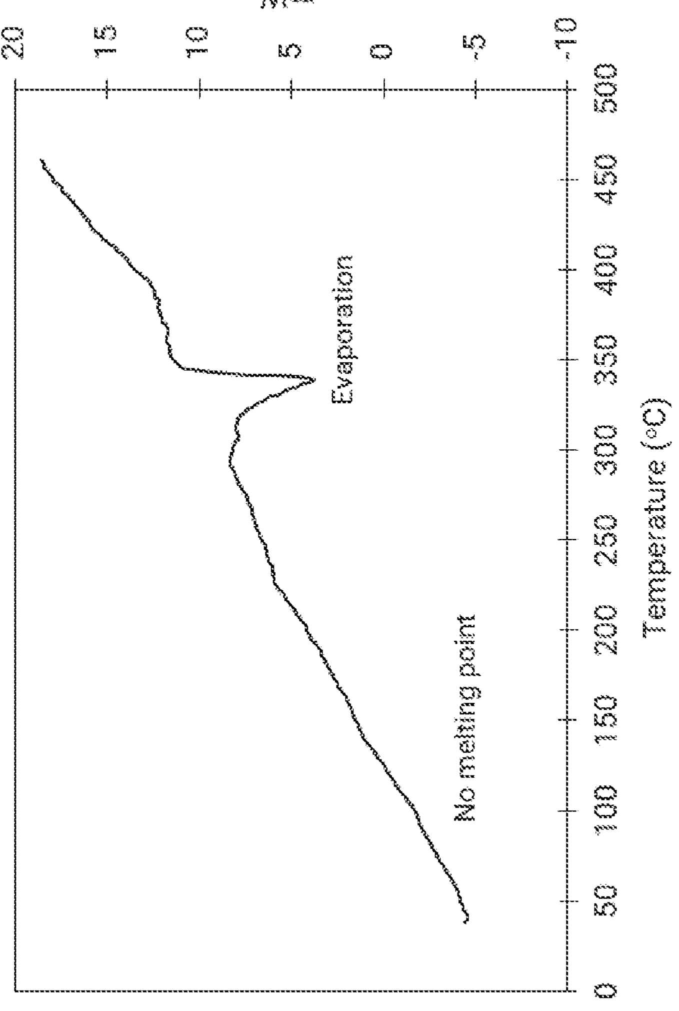
FIG. 5 shows a DTA graph demonstrating the melting point of Bis(tri-sec-butyl cyclopentadienyl)Barium(II), $Ba(sBu_3Cp)_2$.

The purified product left a 2.7% residual mass and showed no melting point during open-cup TGA/DTA analysis measured at a temperature rising rate of 10° C./min in an inert atmosphere that flows nitrogen at 200 mL/min. These results are shown in FIG. 4 and FIG. 5, which are TGA and DTA graphs illustrating the weight (%) and heat flow, upon temperature increase.

Comparative Example 1 Bis(tri-iso-propyl cyclopentadienyl)Strontium(II), $Sr(iPr_3Cp)_2$

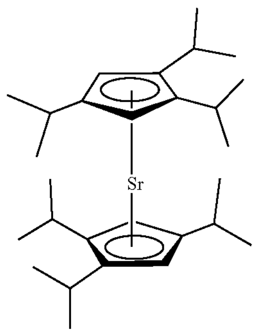

Figure 6:
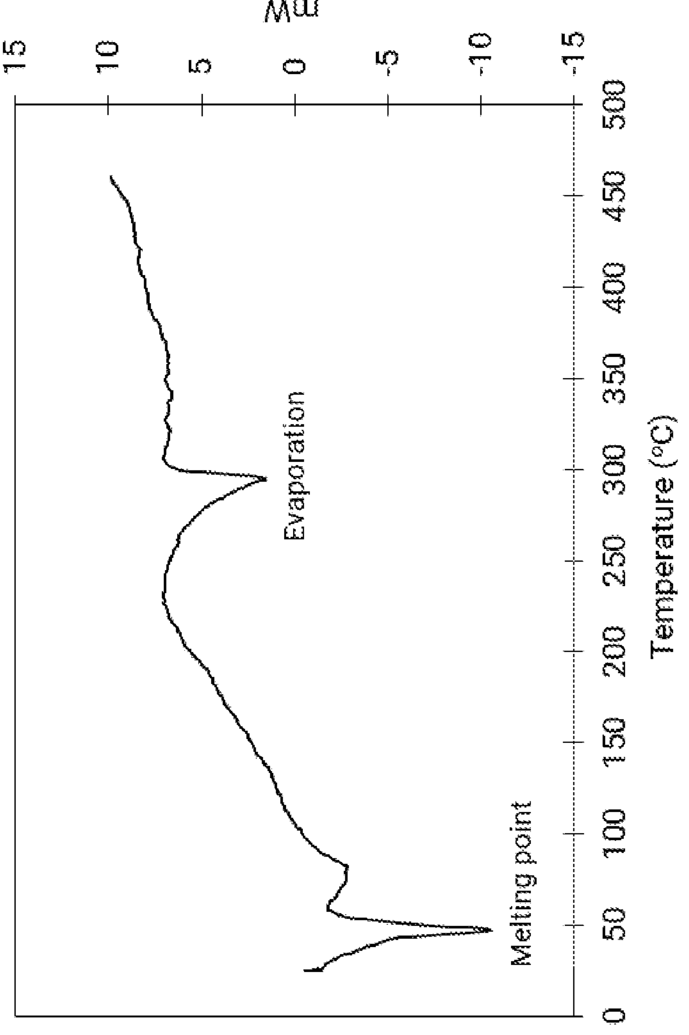
FIG. 6 shows a DTA graph demonstrating the melting point of Bis(tri-iso-propyl cyclopentadienyl)Strontium(II), $Sr(iPr_3Cp)_2$.

Melting point has been shown at 44° C. during open-cup DTA analysis measured at a temperature rising rate of 10° C./min in an inert atmosphere that flows nitrogen at 200 mL/min. These result is shown in FIG. 6, which is a DTA graphs illustrating the heat flow upon temperature increase.

Comparative Example 2 Bis(tri-tert-butyl cyclopentadienyl)Strontium(II), $Sr(tBu_3Cp)_2$

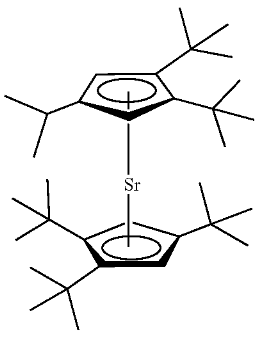

Figure 7:
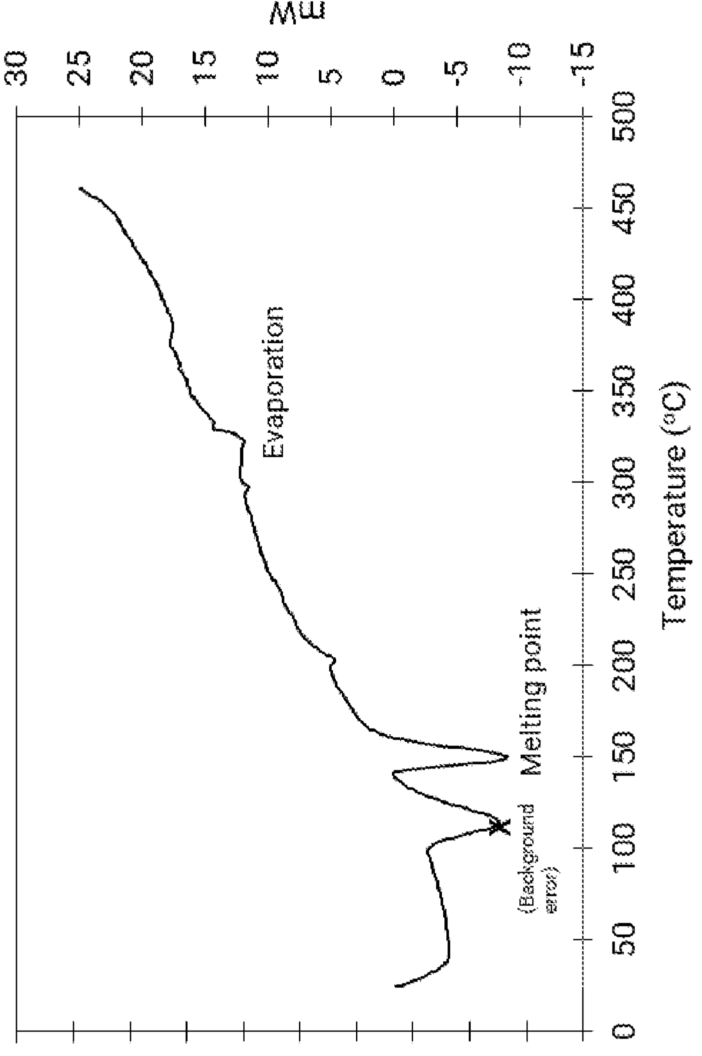
FIG. 7 shows a DTA graph demonstrating the melting point of Bis(tri-tert-butyl cyclopentadienyl)Strontium(II), $Sr(tBu_3Cp)_2$.

Melting point has been shown at 143° C. during open-cup DTA analysis measured at a temperature rising rate of 10° C./min in an inert atmosphere that flows nitrogen at 200 mL/min. These result is shown in FIG. 7, which is a DTA graphs illustrating the heat flow upon temperature increase.

Comparative Example 3 Bis(tri-iso-propyl cyclopentadienyl)Barium(II), $Ba(iPr_3Cp)_2$

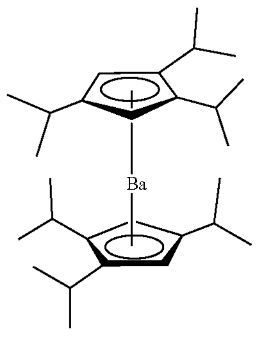

Figure 8:
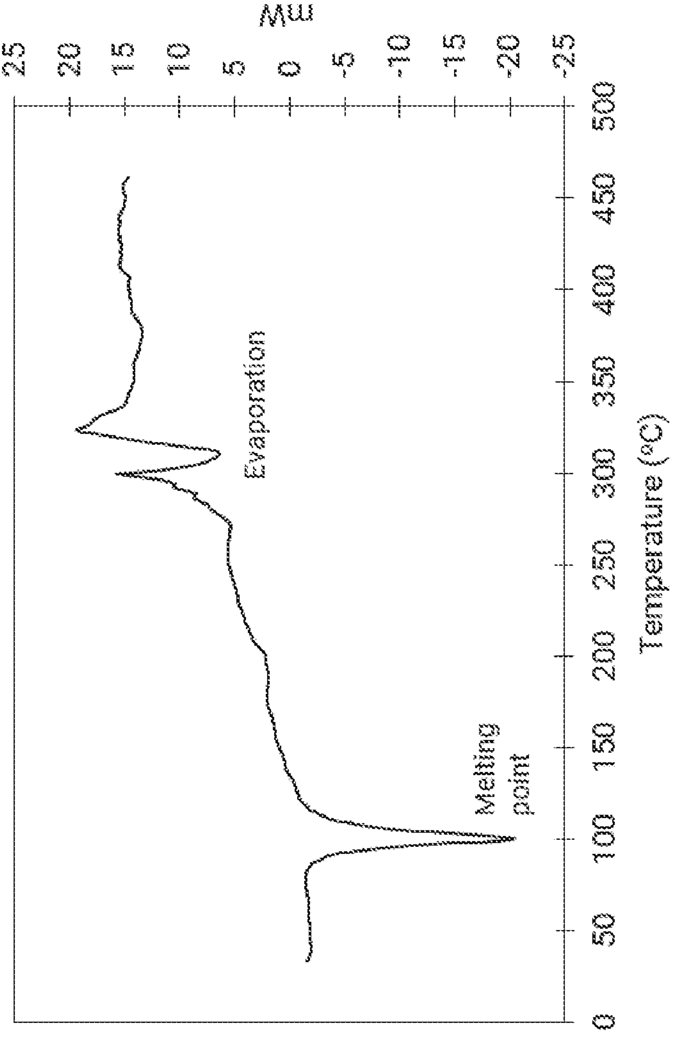
FIG. 8 shows a DTA graph demonstrating the melting point of Bis(tri-iso-propyl cyclopentadienyl)Barium(II), $Ba(iPr_3Cp)_2$.
Figure 10:
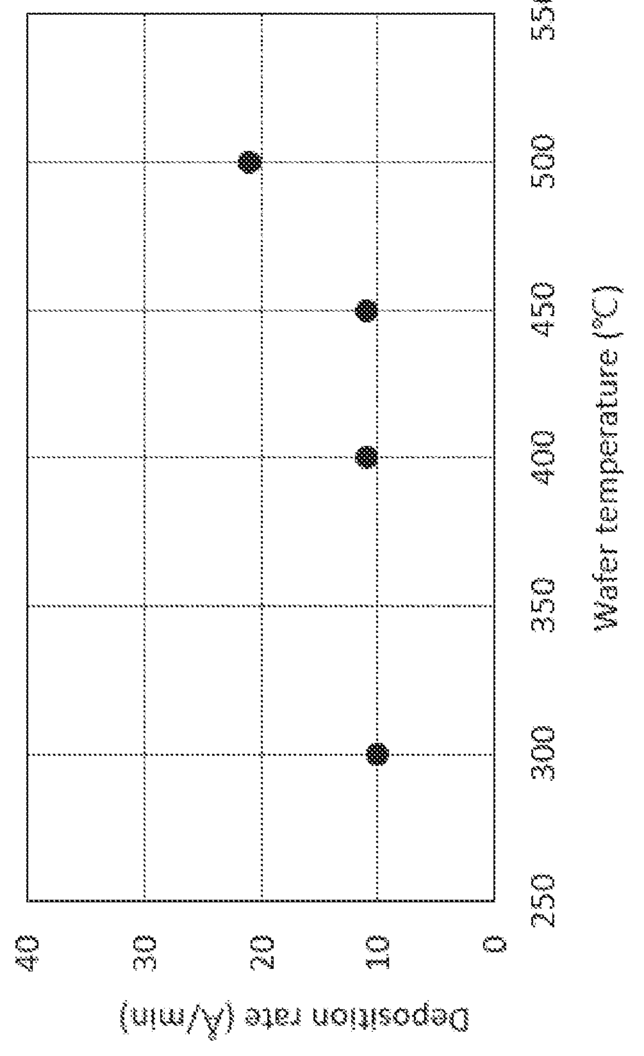
FIG. 10 Shows a ALD window of Bis(tri-sec-butyl cyclopentadienyl)Strontium(II), $Sr(sBu_3Cp)_2$.

Melting point has been shown at 92° C. during open-cup DTA analysis measured at a temperature rising rate of 10° C./min in an inert atmosphere that flows nitrogen at 200 mL/min. These result is shown in FIG. 8, which is a DTA graphs illustrating the heat flow upon temperature increase.

The pyrolysis test showed that the precursor was stable up to 450° C. and decomposed above 500° C. It demonstrated the new Sr precursor is thermally stable so that it can allow a high temperature process with ozone to deposit SrO films.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

The invention claimed is:

1. A method of forming a Group 2 metal containing film on a substrate, the method comprising a) exposing the substrate to a vapor of a Group 2 metal containing film forming composition that contains Group 2 metal precursor selected from the group consisting of Bis (tri-sec-butyl cyclopentadienyl) Strontium (II), $Sr(sBu_3Cp)_2$, Bis (tri-sec-butyl cyclopentadienyl) Barium (II), $Ba(sBu_3Cp)_2$, Bis (tri-iso-propyl cyclopentadienyl) Strontium (II), $Sr(iPr_3Cp)_2$, Bis (tri-tert-butyl cyclopentadienyl) Strontium (II), $Sr(tBu_3Cp)_2$, Bis (tri-iso-propyl and cyclopentadienyl) Barium (II), $Ba(iPr_3Cp)_2$, b) depositing at least part of the Group 2 metal precursor onto the substrate to form the Group 2 metal-containing film through a vapor deposition process; and c) repeating a) and b) until a desired thickness of the Group 2 metal-containing film is formed.

2. The method of claim 1, further comprising exposing the substrate to a co-reactant selected from an oxidizer agent or a nitrigen agent.

3. The method of claim 2, wherein the co-reactant is selected from $O_3$, $O_2$, $H_2O$, $H_2O_2$, $D_2O$, ROH wherein $R=C_1-C_{10}$ linear or branched hydrocarbon, or combination thereof.

4. The method of claim 2, wherein the co-reactant is selected from $NH_3$, NO, $N_2O$, hydrazines, amines or combinations thereof.

5. The method of claim 2, wherein the co-reactant is $H_2O$.

6. The method of claim 1, wherein the Group 2 metal precursor is liquid.

7. The method of claim 1, wherein the Group 2 metal precursor is mixed with a solvent.

8. The method of claim 7, wherein the solvent is an alkane, alkene, alkyne, alkyl alcohol, amino alcohol, primary-, secondary-, tertiary-amine, tetrahydrofuran, dichloromethane, ethyl acetate, butyl acetate, acetonitrile, or dimethylformamide.

9. The method of claim 7, wherein the solvent includes octane, ethyl benzene, xylene, mesitylene, decalin, decane, and dodecane.

10. The method of claim 7, wherein a concentration of the Group 2 metal precursor in the solvent ranges from approximately 50% w/w and approximately 100.0% w/w.

11. The method of claim 1, wherein the substrate is exposed to the vapor of the Group 2 metal containing film forming composition at a temperature raging from room temperature to approximately 500° C.

12. The method of claim 1, wherein the Group 2 metal precursor is Bis (tri-sec-butyl cyclopentadienyl) Strontium (II), Sr $(sBu_3Cp)_2$.

13. The method of claim 1, wherein the Group 2 metal precursor is Bis (tri-sec-butyl cyclopentadienyl) Barium (II), Ba $(sBu_3Cp)_2$.

14. The method of claim 1, wherein the vapor deposition process is a MOCVD process, or an ALD process selected from a thermal ALD, spatial ALD, temporal ALD, or plasma ALD process.

15. The method of claim 1, wherein the vapor deposition process is not a plasma ALD process.

16. The method of claim 1, wherein the Group 2 metal-containing film is a SrO film.

17. The method of claim 1, wherein the Group 2 metal-containing film is a BaO film.

18. A method of depositing a SrO film on a substrate, the method comprising the steps of:

a) exposing the substrate to a vapor of Bis (tri-sec-butyl cyclopentadienyl) Strontium (II), Sr $(sBu_3Cp)_2$;
b) exposing the substrate to a co-reactant $H_2O$;
c) depositing at least part of the Bis (tri-sec-butyl cyclopentadienyl) Strontium (II), Sr $(sBu_3Cp)_2$ metal precursor onto the substrate to form the SrO film through a vapor deposition process; and
d) repeating a)-c) until a desired thickness of the SrO film is formed.

19. A method of depositing a BaO film on a substrate, the method comprising the steps of:

a) exposing the substrate to a vapor of Bis (tri-sec-butyl cyclopentadienyl) Barium (II), Ba $(sBu_3Cp)_2$;
b) exposing the substrate to a co-reactant $H_2O$;
c) depositing at least part of the Bis (tri-sec-butyl cyclopentadienyl) Barium (II), $Ba(sBu_3Cp)_2$ metal precursor onto the substrate to form the BaO film through a vapor deposition process; and
d) repeating a)-c) until a desired thickness of the BaO film is formed.

* * * * *